(12) United States Patent
Wada

(10) Patent No.: US 11,027,949 B2
(45) Date of Patent: Jun. 8, 2021

(54) TRANSPORT VEHICLE AND TRANSPORT METHOD

(71) Applicant: Murata Machinery, Ltd., Kyoto (JP)

(72) Inventor: Eiji Wada, Inuyama (JP)

(73) Assignee: Murata Machinery, Ltd., Kyoto (JP)

(*) Notice: Subject to any disclaimer, the term of this patent is extended or adjusted under 35 U.S.C. 154(b) by 280 days.

(21) Appl. No.: 16/301,277

(22) PCT Filed: Mar. 30, 2017

(86) PCT No.: PCT/JP2017/013244
§ 371 (c)(1),
(2) Date: Nov. 13, 2018

(87) PCT Pub. No.: WO2017/199593
PCT Pub. Date: Nov. 23, 2017

(65) Prior Publication Data
US 2020/0270102 A1   Aug. 27, 2020

(30) Foreign Application Priority Data
May 20, 2016 (JP) .............................. JP2016-101338

(51) Int. Cl.
*B66C 13/18* (2006.01)
*H01L 21/677* (2006.01)
(Continued)

(52) U.S. Cl.
CPC ............... *B66C 13/06* (2013.01); *B66C 1/16* (2013.01); *B66C 13/18* (2013.01); *H01L 21/677* (2013.01);
(Continued)

(58) Field of Classification Search
CPC ......... H01L 21/67259; H01L 21/67733; H01L 21/67736; H01L 21/6773; H01L 21/677;
(Continued)

(56) References Cited

U.S. PATENT DOCUMENTS

| 2003/0001118 A1* | 1/2003 | Murata ............. H01L 21/67259 250/559.33 |
| 2006/0182553 A1* | 8/2006 | Yamamoto ............. B65G 47/61 414/278 |

(Continued)

FOREIGN PATENT DOCUMENTS

| JP | 2008-074613 A | 4/2008 |
| JP | 2008-184298 A | 8/2008 |

(Continued)

*Primary Examiner* — Michael R Mansen
*Assistant Examiner* — Juan J Campos, Jr.
(74) *Attorney, Agent, or Firm* — DLA Piper LLP (US)

(57) ABSTRACT

A transport vehicle includes a body; a lift platform that includes a holder to hold an article, the lift platform being ascendable and descendable with respect to the body; a lift driver that raises or lowers the lift platform by feeding out or taking up a flexible suspension support; a sensor provided in the lift driver and emits a detection wave having directivity toward a certain lower position; a lateral extender that causes the lift driver to project laterally from the body while providing cantilever support for the lift driver; and a corrector that corrects a shift in an emission direction of the detection wave that arises from bending of the lateral extender in a state in which the lift driver is caused to project laterally from the body by the lateral extender.

11 Claims, 12 Drawing Sheets

(51) Int. Cl.
*H01L 21/68* (2006.01)
*B66C 13/06* (2006.01)
*B66C 1/16* (2006.01)

(52) U.S. Cl.
CPC ...... *H01L 21/68* (2013.01); *B65G 2201/0297* (2013.01)

(58) Field of Classification Search
CPC ......... H01L 21/67706; H01L 21/67712; H01L 21/68; H01L 21/68707; B65G 2201/0297; B65G 1/00; B66C 13/18
See application file for complete search history.

(56) References Cited

U.S. PATENT DOCUMENTS

| | | | |
|---|---|---|---|
| 2012/0114453 A1* | 5/2012 | Ota | H01L 21/67724 414/281 |
| 2014/0144859 A1* | 5/2014 | Fujiwara | B66C 19/00 212/71 |
| 2015/0255318 A1* | 9/2015 | Wada | H01L 21/67736 212/276 |
| 2016/0276191 A1* | 9/2016 | Kinugawa | H01L 21/67259 |

FOREIGN PATENT DOCUMENTS

| | | | | |
|---|---|---|---|---|
| JP | 2009-208888 A | 9/2009 | | |
| JP | 2010-215359 A | 9/2010 | | |
| JP | 2011-057357 A | 3/2011 | | |
| JP | 2015-074547 A | 4/2015 | | |
| JP | 5821171 B2 | 10/2015 | | |
| KR | 10-2008-0027726 A | 3/2008 | | |
| WO | WO-2014017221 A1 * | 1/2014 | ....... | H01L 21/67259 |
| WO | WO-2014017222 A1 * | 1/2014 | ....... | H01L 21/6773 |
| WO | WO-2015053214 A1 * | 4/2015 | ....... | B66C 15/045 |

\* cited by examiner (A)

(B)

(C)

TRANSPORT VEHICLE AND TRANSPORT METHOD

TECHNICAL FIELD

This disclosure relates to a transport vehicle and a transport method.

BACKGROUND

Manufacturing factories such as semiconductor manufacturing factories employ transport vehicles that travel along rails installed on ceilings to transport articles such as front opening unified pods (FOUPs) for semiconductor wafers or reticle pods for transporting reticles, for example. A transport vehicle includes a body, a lift platform that is ascendable and descendable with respect to the body, a lift driver that raises or lowers the lift platform, and a lateral extender that causes the lift driver to project from the body laterally with respect to a traveling direction. The transport vehicle stops at a position set in a factory to transfer an article and, in a state in which the lift driver is caused to project laterally by the lateral extender, transfers the article by raising or lowering the lift platform by the lift driver and gripping or releasing the article with a gripper device included in the lift platform. The lift driver of such transport vehicle includes a sensor that emits a detection wave having directivity such as laser light, toward a certain lower position to detect a state of the lower position (refer to Japanese Patent No. 5821171, for example).

In the transport vehicle described above, the lateral extender causes the lift driver to project laterally from the body, and the lateral extender bends downwardly due to the weight of the lift driver or the article, or other factors. This bending causes an emission direction of the detection wave to shift. As a result, the detection wave may be emitted toward a position outside a certain target area, causing a false detection by the sensor.

In view of above-described circumstances, it could be helpful to provide a transport vehicle and a transport method that enable appropriate transfer of an article by suppressing false detections by a sensor.

SUMMARY

I thus provide:

A transport vehicle includes: a body; a lift platform that includes a holder to hold an article, the lift platform being ascendable and descendable with respect to the body; a lift driver that raises or lowers the lift platform by feeding out or taking up a flexible suspension support; a sensor provided in the lift driver and emits a detection wave having directivity toward a certain lower position; a lateral extender that causes the lift driver to project laterally from the body while providing cantilever support for the lift driver; and a corrector that corrects a shift in an emission direction of the detection wave that arises from bending of the lateral extender in a state in which the lift driver is caused to project laterally from the body by the lateral extender. The corrector may change the angle of the sensor with respect to the lift driver. The corrector may include an actuator that changes the angle of the sensor. The corrector may change the angle of the sensor by using gravity. The corrector may change the angle of the sensor in conjunction with projecting movement of the lift driver by the lateral extender. The sensor may be at least one of: a swing detection sensor that detects whether the detection wave is emitted to a certain range of the lift platform when the lift platform is raised or lowered; and a lookdown sensor that emits the detection wave to the vicinity of a lowering destination of the lift platform to detect whether a foreign matter is present.

A transport method transports an article by a transport vehicle, the transport vehicle including: a body; a lift platform that includes a holder to hold the article, the lift platform being ascendable and descendable with respect to the body; a lift driver that raises or lowers the lift platform by feeding out or taking up a flexible suspension support; a sensor provided in the lift driver and emits a detection wave having directivity toward a certain lower position; and a lateral extender that causes the lift driver to project laterally from the body while providing cantilever support for the lift driver. The transport method includes, when the lateral extender causes the lift driver to project laterally from the body, correcting a shift in an emission direction of the detection wave that arises from bending of the lateral extender.

The transport vehicle corrects, by the corrector, a shift in an emission direction of a detection wave that arises from bending of the lateral extender, and is thus capable of suppressing emission of a detection wave to a position outside a certain target area. This configuration enables suppression of false detection by a sensor and appropriate transfer of an article.

In a configuration in which the corrector changes the angle of the sensor with respect to the lift driver, the emission direction of the detection wave can be corrected with a simple structure. In a configuration in which the corrector includes an actuator that changes the angle of the sensor, the emission direction of the detection wave can be corrected easily by the actuator. In a configuration in which the corrector changes the angle of the sensor by using gravity, the emission direction of the detection wave can be corrected with a simple structure using gravity. In a configuration in which the corrector changes the angle of the sensor in conjunction with projecting movement of the lift driver by the lateral extender, the emission direction of the detection wave is corrected in conjunction with projecting movement of the lift driver, and thus it is ensured that a shift in the emission direction of the detection wave is corrected. When the sensor is at least one of a swing detection sensor and look down sensor, the swing detection sensor detecting whether the detection wave is emitted to a certain range of the lift platform when the lift platform is raised or lowered, and the lookdown sensor emitting the detection wave to the vicinity of a lowering destination of the lift platform to detect whether a foreign matter is present, the emission direction of the detection wave is corrected by the corrector, and thus raising or lowering of the lift platform or transfer of an article can be performed appropriately.

The transport method corrects a shift in the emission direction of the detection wave that arises from bending of the lateral extender. Thus, it is possible to suppress false detection by the sensor, and raise or lower the lift platform and transfer an article appropriately, which ensures stable transport of the article.

DESCRIPTION OF REFERENCE SIGNS

Figure 1:
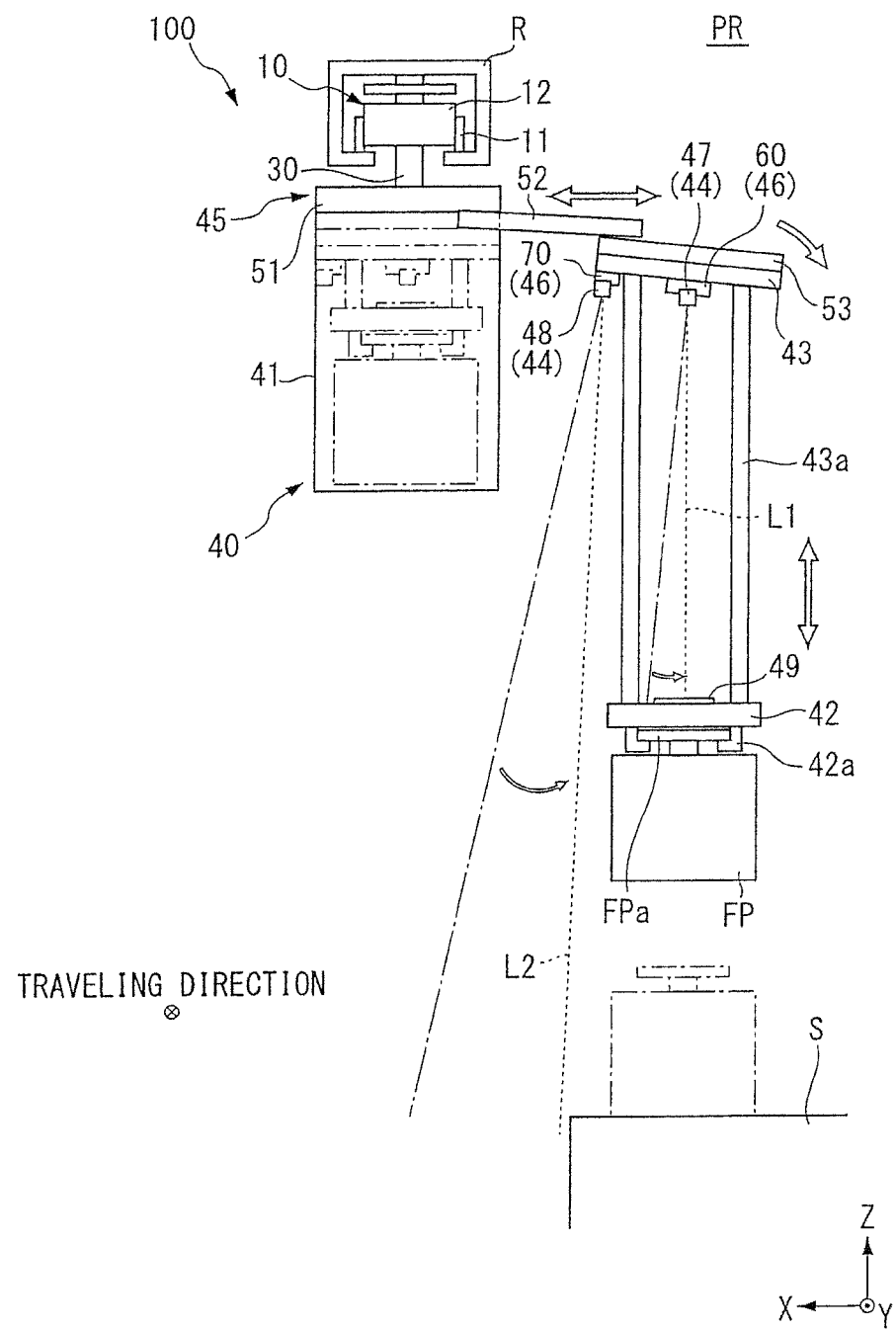
FIG. 1 is a diagram illustrating an example of a transport vehicle according to an example.

L1, L2 laser light (detection wave)
FP article
40 transfer device
41 body
42 lift platform
42a gripper (holder)
43 lift driver
43a belt (suspension support)
44 sensor
45 lateral extender
46, 60A, 60B, 60C corrector
47 swing detection sensor (sensor)
48 lookdown sensor (sensor)
60, 60D first corrector (corrector)
66a, 76a actuator
70, 70D second corrector (corrector)
100 transport vehicle

DETAILED DESCRIPTION

The following describes examples with reference to the drawings. However, this disclosure is not limited to the examples. In the drawings, scale is changed as necessary to illustrate the example, such as by enlarging or emphasizing a part. In the following drawings, an XYZ coordinate system is used to describe the directions in each drawing. In the XYZ coordinate system, a plane that is parallel to a horizontal plane is defined as an XY plane. In the XY plane, a traveling direction of a transport vehicle 100 is described as a Y direction, and a horizontal direction orthogonal to the Y direction is described as an X direction. A direction perpendicular to the XY plane is described as a Z direction. For each of the X direction, the Y direction, and the Z direction, description is made with a definition in which a direction indicated by an arrow is the positive (+) direction and a direction opposite to the direction indicated by the arrow is the negative (−) direction. A direction of rotation around the X axis is described as a θX direction, a direction of rotation around the Y axis is described as a θY direction, and a direction of rotation around the Z axis is described as a θZ direction.

FIG. 1 is a diagram illustrating an example of a transport vehicle. As illustrated in FIG. 1, the transport vehicle 100 is installed in a processing room PR such as a clean room. In the processing room PR, a device such as a semiconductor processing device, which is not illustrated, is installed on a floor surface. On a ceiling part of the processing room PR, a rail R that is a track that guides the transport vehicle 100 is provided. The rail R includes a traveling rail and a power supply rail.

The transport vehicle 100 travels along the rail R in the −Y direction, for example. The transport vehicle 100 includes, as illustrated in FIG. 1, a travel driver 10, a coupler 30, and a transfer device 40. Each part of the transport vehicle 100 is controlled by a controller, which is not illustrated. The travel driver 10 is located inside the rail R and includes a plurality of rollers 11 in contact with an inner surface of the rail R, and a driving device 12 that rotates the rollers 11. The transport vehicle 100 includes a power receiver. The power receiver receives electrical power through a non-contact feeder line provided to the power supply rail in the rail R and supplies the electrical power to drivers such as the travel driver 10, included in the transport vehicle 100. The coupler 30 is mounted on a lower side (a −Z side) of the travel driver 10 and couples the travel driver 10 to the transfer device 40.

The transfer device 40 includes a body 41, a lift platform 42, a lift driver 43, sensors 44, a lateral extender 45, and a corrector 46. The body 41 is coupled to the travel driver 10 by the coupler 30. The body 41 moves in an integrated manner with the travel driver 10 along the rail R.

The lift platform 42 is ascendable and descendable (movable in the Z direction) with respect to the body 41. The lift platform 42 includes a gripper 42a serving as a holder that holds an article FP. The article FP is, for example, a front opening unified pod (FOUP) that houses semiconductor wafers or a reticle pod for housing reticles. The gripper 42a is capable of gripping or releasing a flange FPa provided on a top part (a surface on the +Z side) of the article FP.

The lift driver 43 raises or lowers (moves in the Z direction) the lift platform 42. The lift driver 43 suspends the lift platform 42 with a plurality of (four, for example) flexible belts (a suspension support) 43a. The lift driver 43 raises or lowers the lift platform 42 by feeding out or taking up the belts 43a.

The sensors 44 are provided in the lift driver 43. The sensors 44 include a swing detection sensor (swing sensor) 47 and a lookdown sensor 48. The swing detection sensor 47 and the lookdown sensor 48 each emit a detection wave having directivity such as laser light toward a certain lower position (in the −Z direction). For the example, the following describes a selected configuration in which the swing detection sensor 47 and the lookdown sensor 48 emit laser light as a detection wave. The swing detection sensor 47 and the lookdown sensor 48 may emit a detection wave having directivity other than laser light such as an ultrasound wave.

The swing detection sensor 47 emits laser light L1 toward a reflecting plate 49 provided on an upper surface (a surface on the +Z side) of the lift platform 42. The swing detection sensor 47 emits the laser light L1 toward the reflecting plate 49 when the lift platform 42 is raised or lowered, and detects a swing of the lift platform 42 on the basis of reflected light. The lookdown sensor 48 emits laser light L2 toward the vicinity of a lowering destination of the lift platform 42. The lookdown sensor 48 emits the laser light L2 and, on the basis of reflected light, detects whether a foreign matter is present in the vicinity of an article mounting table S that is the lowering destination of the lift platform 42. For example, the lookdown sensor 48 detects whether an obstacle such as an operator is present on a passage side of the article mounting table S.

The lateral extender 45 causes the lift driver 43 to project laterally (in the X direction) from the body 41 while providing cantilever support for the lift driver 43. The lateral extender 45 includes an upper section 51, a middle section 52, and a lower section 53. The upper section 51 is fixed to an upper part of the body 41. The middle section 52 is attached to a lower side of the upper section 51. The middle section 52 moves in the +X direction or the −X direction, that is, laterally from the body 41, along a guide not illustrated. The lower section 53 is attached to a lower side of the middle section 52. The lower section 53 moves in the +X direction or the −X direction with respect to the middle section 52. The middle section 52 and the lower section 53 are moved by a driving device, which is not illustrated. Although FIG. 1 illustrates an example in which the middle section 52 and the lower section 53 move toward the −X side with respect to the body 41, the example is not limited to this configuration. The middle section 52 and the lower section 53 may move toward the +X side with respect to the body 41.

The lift driver 43 is attached to a lower surface of the lower section 53. A revolution driver, which is not illustrated, capable of revolving the lift driver 43 in the θZ direction may be provided. As illustrated in FIG. 1, in a state in which the middle section 52 and the lower section 53 are caused to project laterally (in the −X direction) from the body 41, a distal end side of the lateral extender 45 in the X direction bends downwardly due to the weight of the middle section 52 and the lower section 53 and the weight of the lift driver 43, the lift platform 42, the article FP, and other components. In this state, the lift driver 43 tilts in the θY direction due to a tilt of the lower section 53. However, because the belts 43a are flexible, the lift platform 42 is positioned vertically below the lift driver 43 in the state in which the lift driver 43 is tilted in the θY direction.

The swing detection sensor 47 and the lookdown sensor 48 (sensors 44) emit laser light L1 and L2, respectively, in a direction shifted from an original emission direction due to the tilt of the lift driver 43. The corrector 46 corrects a shift in an emission direction of the laser light L1 and L2 that arises from bending of the lateral extender 45 in a state in which the lift driver 43 is caused to project laterally from the body by the lateral extender 45. The corrector 46 includes a first corrector 60 and a second corrector 70. The first corrector 60 corrects a shift in the emission direction of the laser light L1 from the swing detection sensor 47. The second corrector 70 corrects a shift in the emission direction of the laser light L2 from the lookdown sensor 48.

Figure 2:
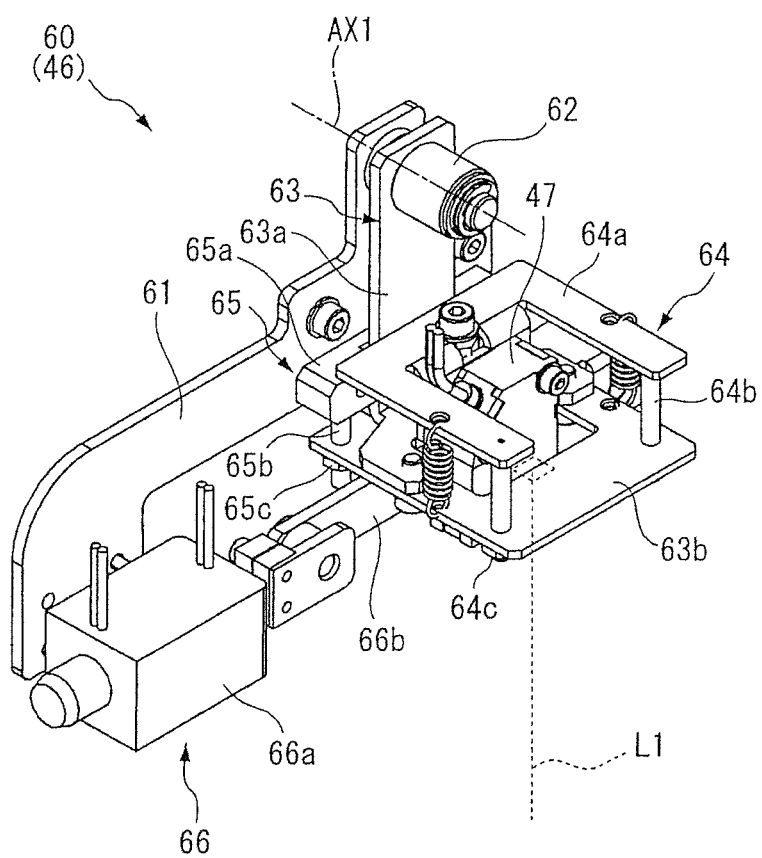
FIG. 2 is a perspective view illustrating an example of a first corrector.
Figure 3:
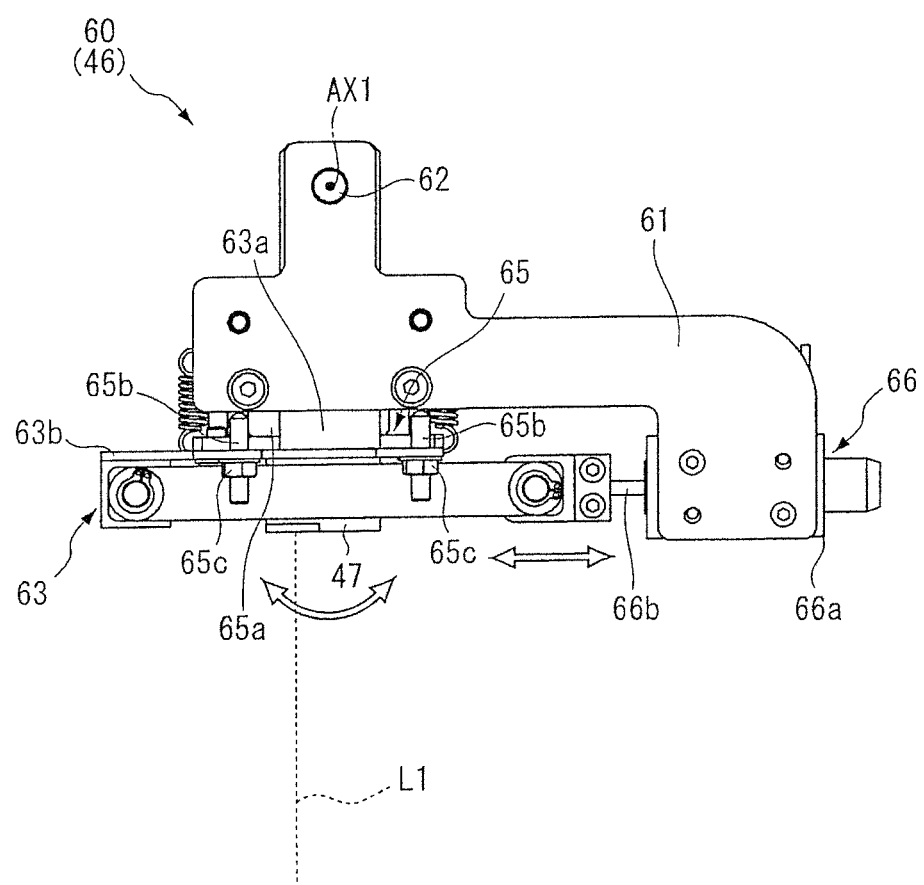
FIG. 3 is a diagram illustrating the example of the first corrector.

FIG. 2 is a perspective view illustrating an example of the first corrector 60. FIG. 3 is a diagram illustrating the example of the first corrector 60 as viewed from the +Y side. As illustrated in FIGS. 2 and 3, the first corrector 60 includes a frame 61, a shaft 62, a mover 63, a tilt adjuster 64, a rotation restrictor 65, and a first correction driver 66.

The frame 61 is formed of a metal plate or other materials and fixed to the lift driver 43 with a bolt or other fasteners. The shaft 62 is formed in a projecting manner from the frame 61. The shaft 62 has a central axis AX1 that is parallel to the Y direction. The mover 63 is rotatable (swingable) in the θY direction around the shaft 62 with respect to the frame 61. The mover 63 includes a suspender 63a and a supporting member 63b. The suspender 63a is formed such that it extends downwardly from the shaft 62, and is supported rotatably in the θY direction around the central axis AX1 of the shaft 62. The supporting member 63b is rotatable in the θY direction around the central axis AX1 in an integrated manner with the suspender 63a. The supporting member 63b has an opening as illustrated in FIG. 2 to support the swing detection sensor 47 via a sensor fixture 64a to be described below.

The tilt adjuster 64 adjusts the tilt of the swing detection sensor 47 with respect to the supporting member 63b. The tilt adjuster 64 includes the sensor fixture 64a, screws 64b, and nuts 64c. The sensor fixture 64a fixes the swing detection sensor 47 with a certain fixture. The sensor fixture 64a has a U-shape when viewed from the Z direction.

The screws 64b are arranged on both sides of the swing detection sensor 47 in the X direction. In the example, the screws 64b are respectively arranged at both ends of the sensor fixture 64a. The screws 64b are screw-coupled into taps formed in the supporting member 63b, and extend upward (in the +Z direction) from the supporting member 63b. Tips of the screws 64b are in contact with a lower surface of the sensor fixture 64a. The nuts 64c are screw-coupled with lower ends of the respective screws 64b on a lower surface of the supporting member 63b. By adjusting the two screws 64b individually, the distance between the sensor fixture 64a and the supporting member 63b is adjusted at respective positions of the screws 64b individually so that the tilt of the swing detection sensor 47 in the θY direction (the emission direction of the laser light L1) can be adjusted to be vertically downwardly (in the −Z direction).

The rotation restrictor 65 defines a rotation range of the mover 63 in the θY direction around the central axis AX1. The rotation restrictor 65 includes a base 65a, screws 65b, and nuts 65c. The base 65a is fixed to the frame 61. As illustrated in FIG. 3, the screws 65b are arranged on the supporting member 63b on both sides of the swing detection sensor 47 in the X direction. The screws 65b are arranged through the supporting member 63b and held by the respective nuts 65c in a manner projecting toward the base 65a. The amount of projection of each screw 65b is adjustable by the screw-coupling position with the nut 65c. When the mover 63 rotates in the θY direction around the central axis AX1, the rotation range of the mover 63 is defined by the tips of the screws 65b making contact with the base 65a. The position of the tip of each screws 65b is set in advance on the basis of an angle at which the lift driver 43 tilts in the θY direction. By being positioned at three points (a position at which one screw 65b is in contact with the base 65a on the −X side, the center, and a position at which the other screws 65b is in contact with the base 65a on the +X side), the rotation restrictor 65 can be used when the lateral extender 45 projects toward either side (laterally projects in the −X direction or in the +X direction).

The first correction driver 66 provides the mover 63 with driving force in the X direction. The first correction driver 66 includes an actuator 66a and a transmitter 66b. A solenoid or the like, for example, is used for the actuator 66a. The transmitter 66b transmits the driving force from the actuator 66a to the supporting member 63b. The transmitter 66b may include an elastic member. When the first correction driver 66 is driven, the driving force in the X direction acts on the supporting member 63b. With this action, the mover 63 rotates in the θY direction around the central axis AX1, the orientation of the swing detection sensor 47 is changed, and the emission direction of the laser light L1 emitted from the swing detection sensor 47 is changed on the basis of the rotated position of the mover 63.

The amount of projection in the X direction of the lateral extender 45 is set to a value in advance, which is substantially constant. Thus, in a state in which the lateral extender 45 projects, the lift driver 43 tilts in the θY direction at a substantially constant value. Thus, in the example, when the lateral extender 45 projects, the first correction driver 66 is driven to rotate the mover 63 and to hold the mover 63 at a certain position by the rotation restrictor 65 as described above so that the emission direction of the laser light L1 emitted from the swing detection sensor 47 can be set toward the reflecting plate 49. The first correction driver 66 is capable of correcting the emission direction of the laser light L1 from the swing detection sensor 47 on the basis of the tilt of the lift driver 43 by two types of control alone, which are driving and no-driving of the first correction driver 66. When the first correction driver 66 is not driven, the transmitter 66b is held at a certain position by an elastic body such as a spring placed inside the solenoid serving as the first correction driver 66. With this configuration, the mover 63 is held at a certain position and the emission direction of the laser light L1 from the swing detection sensor 47 is set downward.

Figure 4:
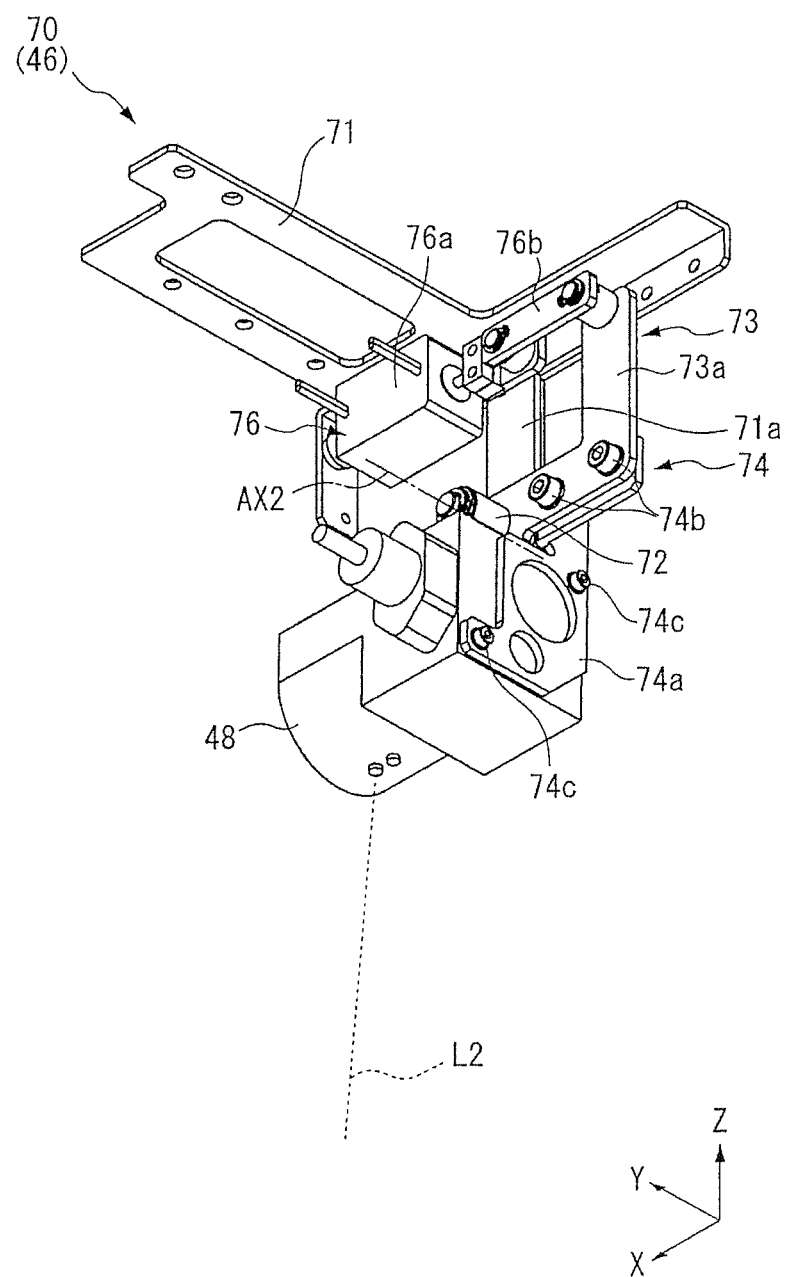
FIG. 4 is a perspective view illustrating an example of a second corrector.
Figure 5:
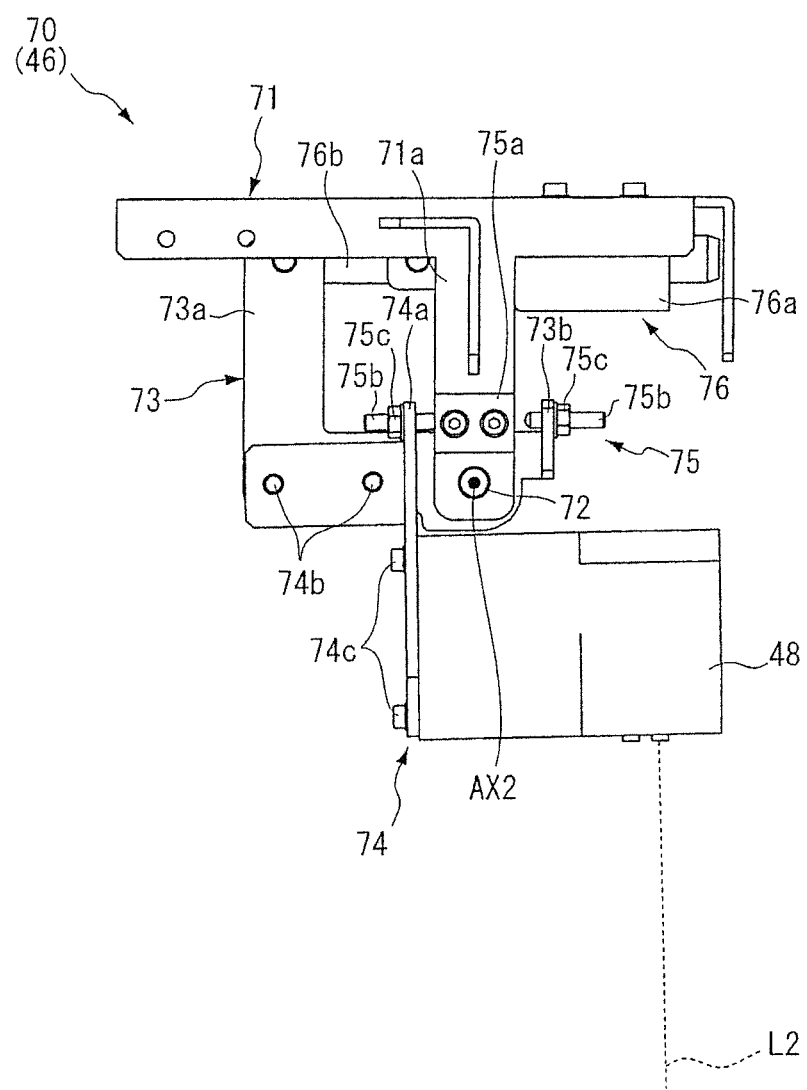
FIG. 5 is a diagram illustrating the example of the second corrector.

FIG. 4 is a perspective view illustrating an example of the second corrector 70. FIG. 5 is a diagram illustrating the example of the second corrector 70 as viewed from the −Y side. As illustrated in FIGS. 4 and 5, the second corrector 70 includes a frame 71, a shaft 72, a mover 73, a tilt adjuster 74, a rotation restrictor 75, and a second correction driver 76.

The frame 71 is formed of a metal plate or other material and fixed to the lift driver 43 with a bolt or other fasteners. The frame 71 includes a strip 71a extending downward. The shaft 72 is formed in a projecting manner from the strip 71a. The shaft 72 has a central axis AX2 that is parallel to the Y direction. The mover 73 is rotatable in the θY direction around the shaft 72 with respect to the frame 71. The mover 73 includes a driving piece 73a and a working piece 73b. The driving piece 73a is formed to extend in the −X direction from the shaft 72 and then bend and extend upwardly. The working piece 73b is arranged on the +X side with respect to the shaft 72 (refer to FIG. 5). The driving piece 73a and the working piece 73b are rotatable in the θY direction around the central axis AX2 in an integrated manner. The driving piece 73a supports the lookdown sensor 48 via a sensor fixture 74a to be described below.

The tilt adjuster 74 adjusts the tilt of the lookdown sensor 48 with respect to the driving piece 73a. The tilt adjuster 74 includes the sensor fixture 74a, mounting screws 74b, and adjusting screws 74c. The sensor fixture 74a is attached to the driving piece 73a with the mounting screws 74b. An upper end of the sensor fixture 74a is arranged across the rotation restrictor 75 from the working piece 73b in the X direction. A lower end of the sensor fixture 74a is arranged in a manner projecting below the shaft 72.

The adjusting screws 74c are mounted on a lower end of the sensor fixture 74a. The adjusting screws 74c fix the lookdown sensor 48 to the sensor fixture 74a and adjust the tilt of the lookdown sensor 48 in the θY direction with respect to the sensor fixture 74a. As illustrated in FIG. 4, in the example when viewed in the +X direction, for example, the adjusting screws 74c are arranged on the lookdown sensor 48 at respective two positions, which are a corner on the −Y side and the +Z side and a corner on the +Y side and the −Z side. By adjusting the two adjusting screws 74c, the distance between the lookdown sensor 48 and the sensor fixture 74a is adjusted so that the tilt of the lookdown sensor 48 in the θY direction with respect to the sensor fixture 74a can be adjusted (so that the laser light L2 is emitted in a certain direction).

The rotation restrictor 75 defines a rotation range of the mover 73 in the θY direction around the central axis AX2. The rotation restrictor 75 includes a base 75a, screws 75b, and nuts 75c. The base 75a is fixed on the strip 71a above the shaft 72. As illustrated in FIG. 5, the two screws 75b are arranged at two locations on both sides of the base 75a in the X direction. One screw 75b is arranged at the working piece 73b, and the other screw 75b is arranged at the upper end of the sensor fixture 74a. The screws 75b are fixed with the nuts 75c in a manner that tips of the screws 75b project toward the base 75a. The amount of projection of each screw 75b is adjustable by the screw-coupling position with the nut 75c. When the mover 73 rotates in the θY direction around the central axis AX2, the rotation range of the mover 73 is defined by the tips of the screw 75b making contact with the base 75a. The position of the tip of each screw 75b is set in advance on the basis of an angle at which the lift driver 43 tilts in the θY direction. By being positioned at three points (a position at which one screw 75b is in contact with the base 75a on the −X side, the center, and a position at which the other screw 75b is in contact with the base 75a on the +X side), the rotation restrictor 75 can be used when the lateral extender 45 projects toward either side (laterally projects in the −X direction or in the +X direction).

The second correction driver 76 provides the mover 73 with driving force in the X direction. The second correction driver 76 includes an actuator 76a and a transmitter 76b. A solenoid or the like, for example, is used for the actuator 76a. The transmitter 76b transmits the driving force from the actuator 76a to the driving piece 73a. The transmitter 76b may include an elastic member. When the second correction driver 76 is driven, the driving force in the X direction acts on the driving piece 73a. With this action, the mover 73 rotates in the θY direction around the central axis AX2, the orientation of the lookdown sensor 48 is changed, and the emission direction of the laser light L2 emitted from the lookdown sensor 48 is changed on the basis of the rotated position of the mover 73.

As described above, in a state in which the lateral extender 45 projects, the lift driver 43 tilts in the θY direction at a substantially constant value. Thus, in the example, when the lateral extender 45 projects, the second correction driver 76 is driven to rotate the mover 73 and hold the mover 73 at a certain position by the rotation restrictor 75 as described above so that the emission direction of the laser light L2 emitted from the lookdown sensor 48 can be corrected. The second correction driver 76 is capable of correcting the emission direction of the laser light L2 from the lookdown sensor 48 on the basis of the tilt of the lift driver 43 by two types of control alone, which are driving and no-driving of the second correction driver 76. When the second correction driver 76 is not driven, the transmitter 76b is held at a certain position by an elastic body such as a spring placed inside the solenoid serving as the second correction driver 76. With this configuration, the mover 73 is held at a certain position and the laser light L2 from the lookdown sensor 48 is set to be directed in a certain emission direction.

The actuators 66a and 76a described above are not limited to a solenoid. For example, a ball screw using an electric motor, a hydraulic or pneumatic cylinder, or a linear motor may be used.

Figure 6:
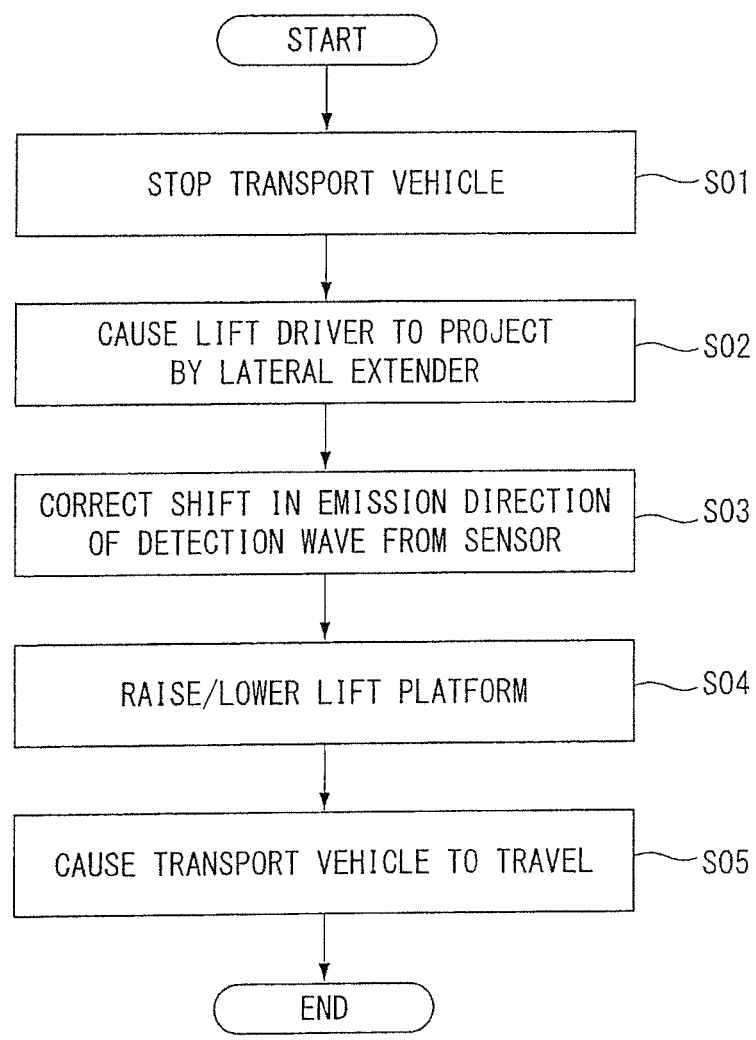
FIG. 6 is a flowchart illustrating an example of operations performed in a transport method.

Next, the following describes operations of the transport vehicle 100 having the configuration described above. The operations of the transport vehicle 100 are executed by the controller, which is not illustrated. FIG. 6 is a flowchart illustrating an example of operations performed in a transport method according to the example. FIG. 6 illustrates an example of raising lowering of the lift platform 42 among the operations of the transport vehicle 100. The controller drives the travel driver 10 to cause the transport vehicle 100 to travel along the rail R. When causing the transport vehicle 100 to travel, the controller keeps the lateral extender 45 in the body 41 instead of causing the lateral extender 45 to project toward the +X side or the −X side.

For example, when placing on the article mounting table S the article FP that has been gripped with the gripper 42a or when gripping the article FP placed on the article mounting table S (refer to FIG. 1) with the gripper 42a, the controller first stops the transport vehicle 100 at a certain position (step S01). In step S01, the stop position of the transport vehicle 100 is set to, for example, a position above and shifted laterally from a transporting destination or a receiving destination such as the article mounting table S.

Next, the controller instructs the lateral extender 45 to cause the lift driver 43 to project laterally from the body 41 (step S02). In step S02, the controller has acquired in advance information indicating that the transporting destination or the receiving destination of the article FP is shifted laterally from a position under the rail. On the basis of this information, the controller causes the lower section 53 and the middle section 52 of the lateral extender 45 to project toward the +X side or the −X side. At this time, the distal end side of the lateral extender 45 in the X direction bends downwardly, and the lift driver 43 tilts in the θY direction. Meanwhile, because the belts 43a are flexible, the lift platform 42 is positioned vertically below (in the −Z direction) the lift driver 43 in a case in which the lift driver 43 is tilted in the θY direction.

After or while causing the lift driver 43 to project laterally from the body 41, the controller corrects a shift in the emission direction of the detection wave from the sensor (step S03). In step S03, the controller drives the actuator 66a of the first correction driver 66 to rotate the mover 63 in the θY direction around the central axis AX1. The mover 63 rotates at a certain angle to a position at which further rotation of the mover 63 is restricted by the rotation restrictor 65 so that the tilt of the swing detection sensor 47 is adjusted. With the adjustment, the laser light L1 emitted from the swing detection sensor 47 is directed downwardly or substantially downwardly to the reflecting plate 49 as indicated by the dotted line (refer to FIG. 1).

Also in step S03, the controller drives the actuator 76a of the second correction driver 76 to rotate the mover 73 in the θY direction. The mover 73 rotates at a certain angle to a position at which further rotation of the mover 73 is restricted by the rotation restrictor 75 so that the tilt of the lookdown sensor 48 is adjusted. With the adjustment, the laser light L2 emitted from the lookdown sensor 48 is directed toward the vicinity of the article mounting table S as indicated by the dotted line (refer to FIG. 1).

Next, after correcting the shift in the emission direction of the detection wave, the controller raises or lowers the lift platform 42 (step S04). In step S04, the controller drives the lift driver 43 to feed out the belts 43a and lower the lift platform 42. With this process, the article FP gripped with the gripper 42a can be placed on the article mounting table S, or the article FP placed on the mounting table S can be gripped with the gripper 42a.

Next, the controller raises the lift platform 42, retracts the lateral extender 45, and causes the transport vehicle 100 to travel (step S05). In step S05, after raising the lift platform 42, the controller retracts the lateral extender 45 into the body 41. Subsequently, the controller drives the travel driver 10 to cause the transport vehicle 100 to travel along the rail R.

As described above, according to the example, when the emission directions of the laser light L1 and L2 are shifted due to bending of the lateral extender 45, the first correction driver 66 and the second correction driver 76 correct the shift in the emission directions of the laser light L1 and L2, respectively. This configuration prevents the laser light L1 and L2 from being emitted to a position outside a certain target area. This configuration enables suppression of false detection by the swing detection sensor 47 or the lookdown sensor 48 and appropriate transfer of the article FP.

Figure 7:
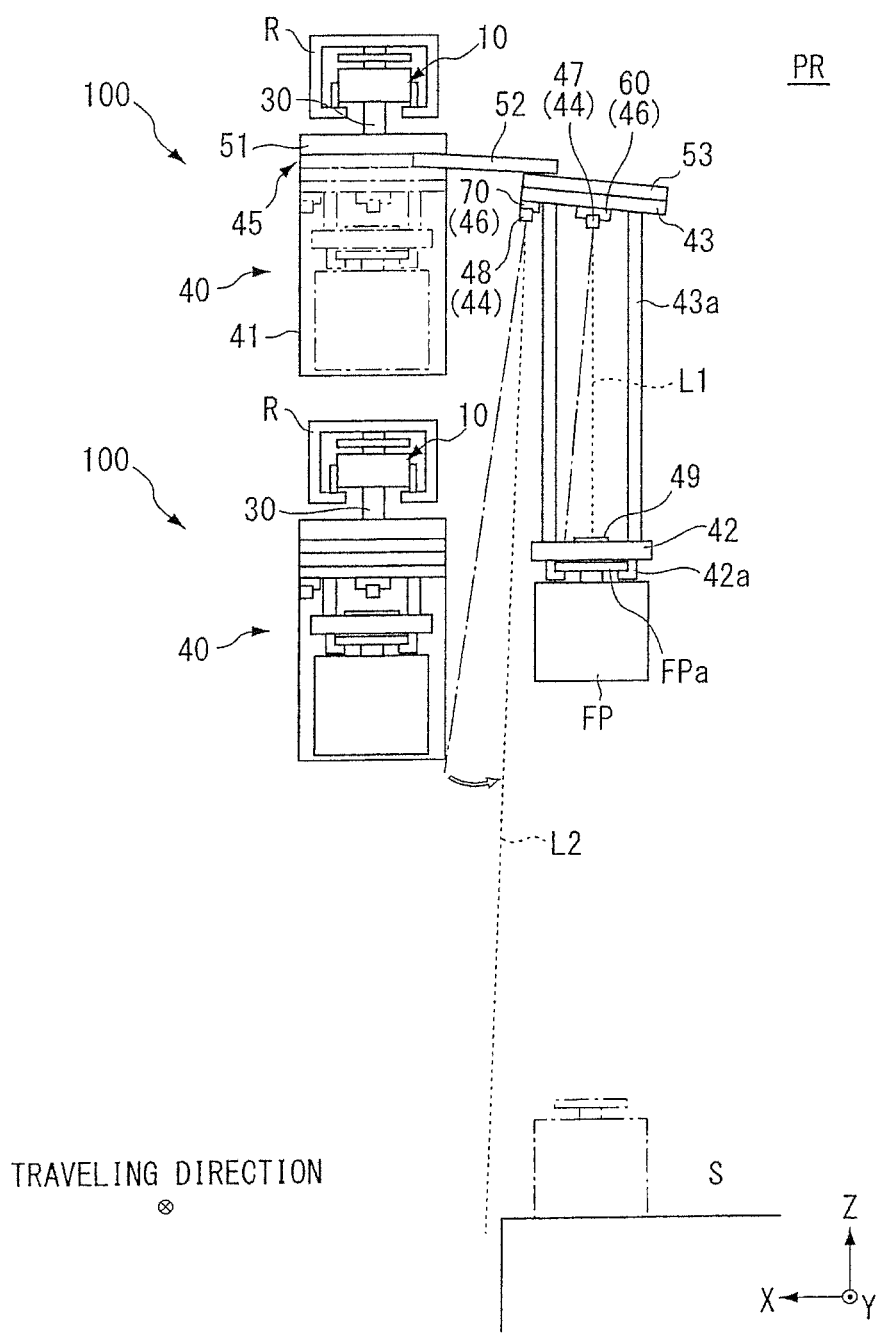
FIG. 7 is a diagram illustrating another example of the transport vehicle.

FIG. 7 is a diagram illustrating another example of the transport vehicle. As illustrated in FIG. 7, two rails R are provided one above the other in the processing room PR, and transport vehicles 100 travel along the rails R, respectively. In this configuration, if the emission direction of the laser light L2 emitted from the lookdown sensor 48 in-stalled in an upper transport vehicle 100 is not corrected, the laser light L2 is emitted to a lower transport vehicle 100, and the lookdown sensor 48 may falsely detect an error, which may stop the movement of the transport vehicle 100 unnecessarily. In the example, the emission direction of the laser light L2 emitted from the lookdown sensor 48 is corrected as indicated by the arrow in FIG. 7 so that false detection by the lookdown sensor 48 can be suppressed.

For the example described above, explanation has been made with reference to a configuration in which the first corrector 60 and the second corrector 70 use the actuator 66a and the actuator 76a, respectively, to change the orientations of the swing detection sensor 47 and the lookdown sensor 48. However, the configuration is not limited thereto.

Figure 8:
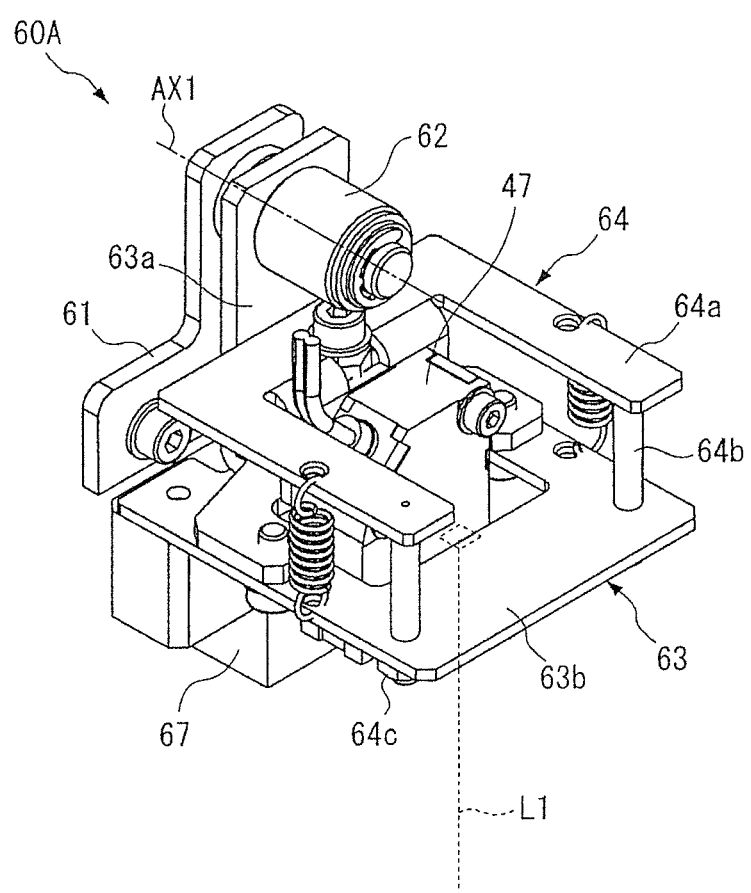
FIG. 8 is a perspective view illustrating another example of the corrector.
Figure 9:
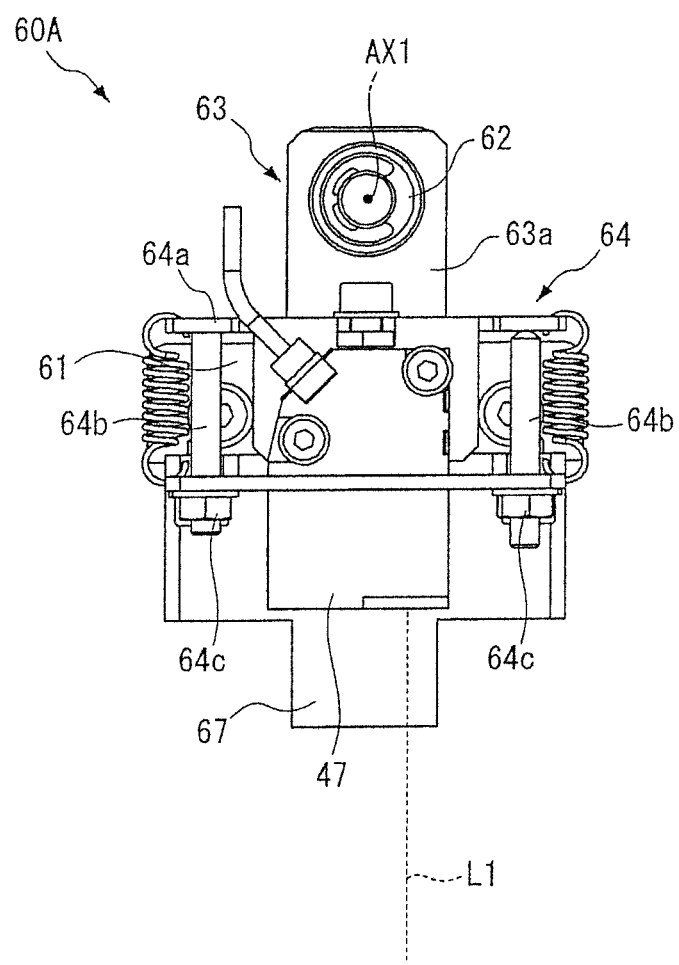
FIG. 9 is a diagram illustrating the corrector in FIG. 8 as viewed from a +Y side.
Figure 10:
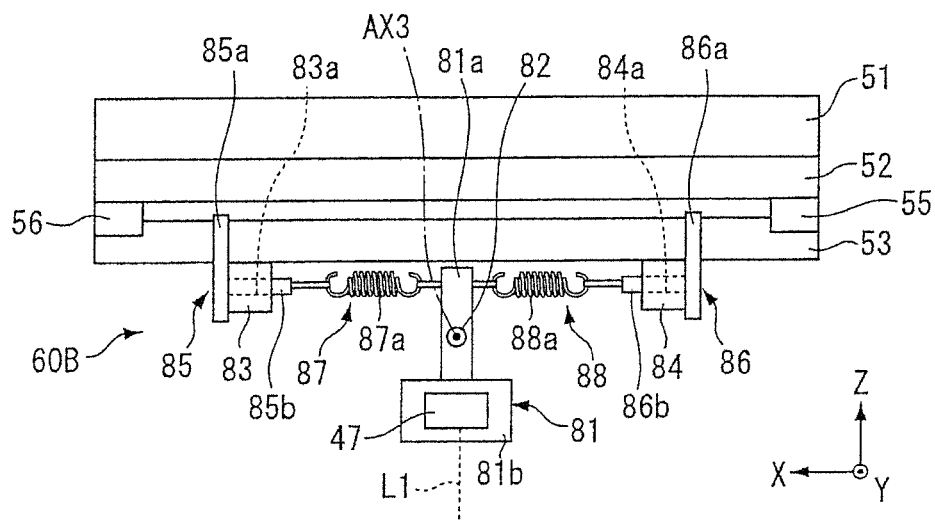
FIG. 10(A) to FIG. 10(C) are perspective views illustrating another example of the corrector.
Figure 10:
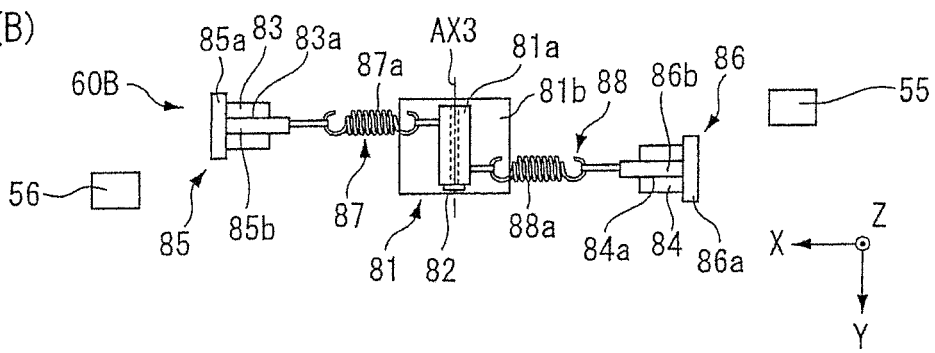
Figure 10:
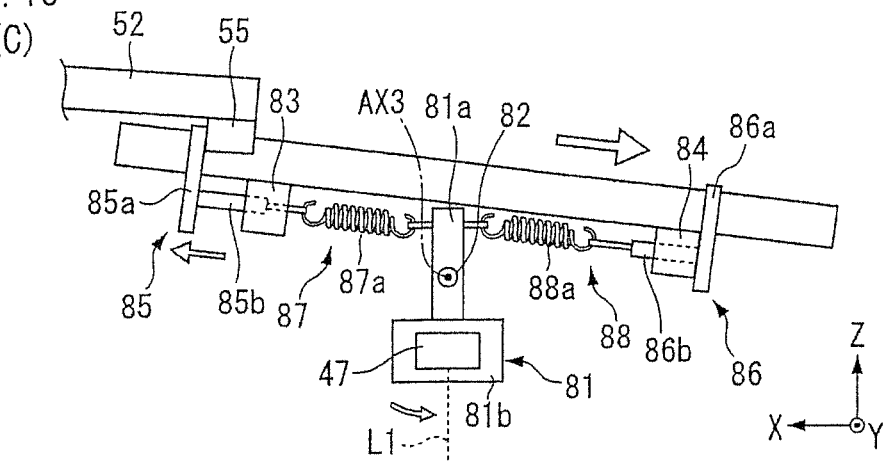
Figure 11:
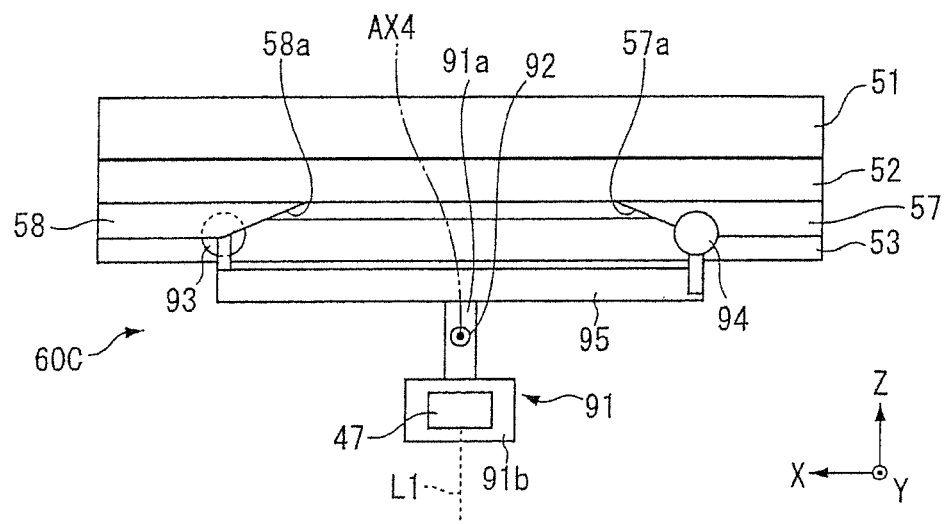
FIG. 11(A) to FIG. 11(C) are perspective views illustrating another example of the corrector.
Figure 11:
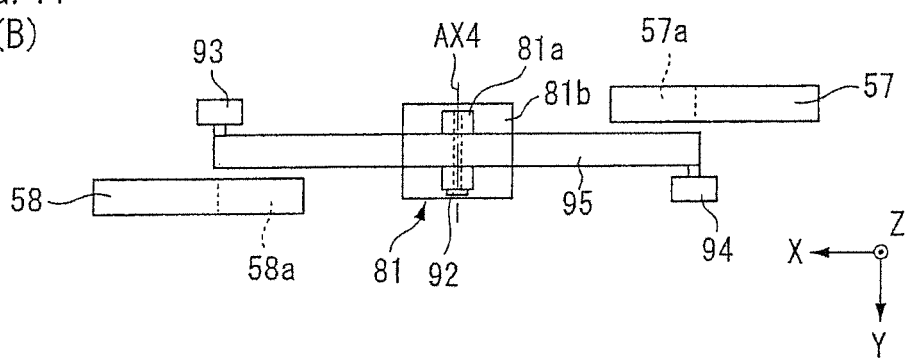
Figure 11:
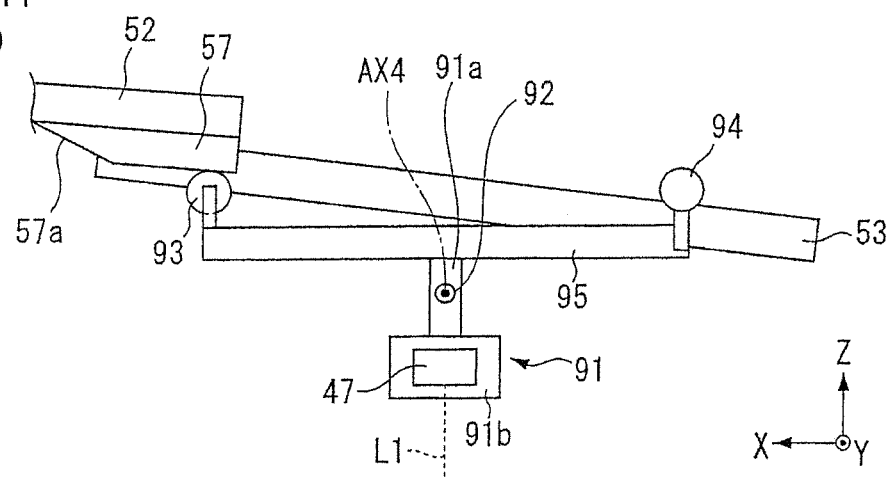

FIG. 8 is a perspective view illustrating another example of the corrector. FIG. 9 is a diagram illustrating the corrector in FIG. 8 as viewed from the +Y side. In the following description, similar members as those described above are assigned with the same symbols and the descriptions thereof are omitted or simplified. A corrector 60A illustrated in FIGS. 8 and 9 is presented as another example of the first corrector 60 described above. This example is applicable to another example of the second corrector 70. In the second corrector 70, the lookdown sensor 48 is provided instead of the swing detection sensor 47. The same applies to FIGS. 10 and 11 to be described below.

As illustrated in FIGS. 8 and 9, the corrector 60A includes the frame 61, the shaft 62, the mover 63, the tilt adjuster 64, and a weight 67. The corrector 60A is different from the example described above in that the weight 67 is provided in place of the rotation restrictor 65 and the first correction driver 66. The weight 67 has certain weight and is mounted on the lower surface of the supporting member 63b. With the weight 67, the center of gravity of the mover 63 is formed below the shaft 62.

In this configuration, when the lift driver 43 is caused to project laterally from the body 41 and the lift driver 43 is tilted in the θY direction as described above, the corrector 60A also tilts. However, the mover 63 keeps facing downward (in the −Z direction). With this configuration, the swing detection sensor 47 also keeps facing downward and the emission direction of the laser light L1 is corrected. This configuration maintains the orientation (changes the orientation with respect to the lift driver 43) of the swing detection sensor 47 by gravity, and thus is capable of correcting the emission direction of the laser light L1 by a simple structure using gravity instead of using an actuator or other mechanisms.

In the corrector 60A, the mover 63 is not limited to being always rotatable. For example, when the lateral extender 45 is not driven, the orientation of the mover 63 may be fixed in a state in which the swing detection sensor 47 faces downward. To fix the orientation of the mover 63, an electromagnet may be used, for example. Holding or releasing the mover 63 with the electromagnet may be controlled by a controller, which is not illustrated.

FIG. 10(A) to FIG. 10(C) are perspective views illustrating another example of the corrector. FIGS. 10(A) and 10(C) illustrate a corrector 60B as viewed from the +Y side. FIG. 10(B) illustrates the corrector 60B as viewed from the +Z side. FIGS. 10(A) to 10(C) omit the lift driver 43. As illustrated in FIGS. 10(A) and (B), the corrector 60B includes a mover 81, a shaft 82, fixing pieces 83 and 84, sliders 85 and 86, and couplers 87 and 88. The mover 81 is supported rotatably in the θY direction around a central axis AX3 of the shaft 82. The mover 81 includes a projection 81a that extends upward from the shaft 82, and a sensor fixture 81b that extends downwardly from the shaft 82 and fixes the swing detection sensor 47. The shaft 82 is provided parallel to the Y direction, and is fixed to the lift driver 43 with a fixture, which is not illustrated.

The fixing pieces 83 and 84 are fixed on the lower surface side of the lower section 53 with the mover 81 interposed between the fixing pieces 83 and 84 in the X direction. The fixing pieces 83 and 84 may be fixed to the lift driver 43. The fixing pieces 83 and 84 have guide grooves 83a and 84a, respectively, along the X direction. As illustrated in FIG. 10(B), the fixing piece 83 on the +X side and the fixing piece 84 on the −X side are arranged at respective positions shifted from each other in the Y direction.

The sliders 85 and 86 are arranged outside the fixing pieces 83 and 84. The sliders 85 and 86 include abutments 85a and 86a extending in the Z direction, and bars 85b and 86b extending in the X direction from the abutments 85a and 86a and guided through the guide grooves 83a and 84a, respectively. Thus, the sliders 85 and 86 are movable in the X direction. The abutments 85a and 86a are contactable with blocks 55 and 56 provided on the middle section 52. As illustrated in FIG. 10(B), the blocks 55 and 56 are arranged at both ends of the middle section 52 in the X direction. The block 55 and the block 56 are arranged at respective positions shifted from each other in the Y direction.

With this arrangement, when the middle section 52 and the lower section 53 move in the X direction relative to each other, the slider 85 is allowed to come into contact with the block 55 on the −X side without coming into contact with the block 56 on the +X side. In the similar manner, the slider 86 is allowed to come into contact with the block 56 on the +X side without coming into contact with the block 55 on the −X side.

The coupler 87 couples the projection 81a of the mover 81 to the bar 85b of the slider 85. The coupler 88 couples the projection 81a to the bar 86b of the slider 86. The couplers 87 and 88 include elastic members 87a and 88a, respectively, such as coil springs. With the elastic members 87a and 88a, when the lateral extender 45 is not driven, the sliders 85 and 86 are held being pressed on the fixing pieces 83 and 84, respectively, so that the mover 81 is held at a certain position. In this state, the swing detection sensor 47 fixed to the mover 81 is adjusted to emit the laser light L1 downwardly.

FIG. 10(C) illustrates an example of the corrector 60B when the lateral extender 45 is driven to cause the middle section 52 and the lower section 53 to project toward the −X side. As illustrated in FIG. 10(C), when the lower section 53 projects toward the −X side with respect to the middle section 52, the block 55 of the middle section 52 comes into contact with the slider 85 and moves the slider 85 in the +X direction. With this movement, the projection 81a of the mover 81 is pulled in the +X direction with the elastic member 87a. When the projection 81a is pulled in the +X direction, the elastic member 88a is pulled in the +X direction. With this movement, the mover 81 rotates in the θY direction around the central axis AX3 of the shaft 82 to a position that is achieved when the elastic members 87a and 88a are stretched.

As a result, the sensor fixture 81b rotates in an integrated manner with the mover 81 in the θY direction, and the position of the sensor fixture 81b is corrected such that the laser light L1 is emitted downwardly (toward the reflecting plate 49 illustrated in FIG. 1 or other drawings) from the swing detection sensor 47. That is, the emission direction of the laser light L1 emitted from the swing detection sensor 47 is corrected in conjunction with the projecting movement of the lower section 53. This configuration enables correction of the emission direction of the laser light L1 by using a simple structure in conjunction with the projecting operation of the lateral extender 45 instead of using an actuator or other mechanisms.

FIG. 10(C) illustrates an example in which the lower section 53 projects toward the −X side. However, the same movement applies to a case in which the lower section 53 projects toward the +X side. In this case, the block 56 on the +X side of the middle section 52 comes into contact with the slider 86 on the −X side and moves the slider 86 in the −X direction. With this movement, the projection 81a is pulled in the −X direction and the mover 81 rotates in the θY direction so that the emission direction of the laser light L1 emitted from the swing detection sensor 47 is corrected.

FIGS. 11(A) to 11(C) are perspective views illustrating another example of the corrector. FIGS. 11(A) and 11(C) illustrate a corrector 60C as viewed from the +Y side. FIG. 11(B) illustrates the corrector 60C as viewed from the +Z side. FIGS. 11(A) to 11(C) omit illustration of the lift driver 43. As illustrated in FIGS. 11(A) and 11(B), the corrector 60C includes a mover 91, a shaft 92, rollers 93 and 94, and a coupler 95. The mover 91 is provided rotatably in the θY direction around a central axis AX4 of the shaft 92.

The mover 91 includes a projection 91a that extends upward from the shaft 92, and a sensor fixture 91b that extends downwardly from the shaft 92 and fixes the swing detection sensor 47. The shaft 92 is provided parallel to the Y direction, and is fixed to the lift driver 43 with a fixture, which is not illustrated.

The rollers 93 and 94 are arranged on both sides of the mover 91 in the X direction and are contactable with blocks 57 and 58 provided on the middle section 52. The rollers 93 and 94 are arranged apart from the lower surface of the middle section 52. However, the rollers 93 and 94 may be arranged in a state being in contact with the lower surface of the middle section 52. The coupler 95 is shaped in a bar that holds the rollers 93, 94, and fixed to an upper end of the projection 91a. The coupler 95 may be coupled to the lift driver 43 with an elastic member, for example. With this elastic member, the coupler 95 is allowed to be held in the horizontal direction when the rollers 93 and 94 are not in contact with the lower surface of the middle section 52. When the coupler 95 is in a horizontal state, the swing detection sensor 47 fixed to the mover 91 is adjusted to emit the laser light L1 downward.

As illustrated in FIG. 11(B), the blocks 57 and 58 are arranged at both ends of the middle section 52 in the X direction. The blocks 57 and 58 are arranged at respective positions shifted from each other in the Y direction. The blocks 57 and 58 have slopes 57a and 58a, respectively. The slope 57a descends (toward the −Z side) in the −X direction. The slope 58a descends in the +X direction. With this arrangement, when the middle section 52 and the lower section 53 move in the X direction relative to each other, the roller 93 comes into contact with a lower surface of the block 57 on the −X side and is guided by the lower surface. The roller 94 comes into contact with a lower surface of the block 58 on the +X side and is guided by the lower surface.

FIG. 11(C) illustrates the corrector 60C when the lower section 53 projects toward the −X side. As illustrated in FIG. 11(C), when the lower section 53 projects toward the −X side with respect to the middle section 52, the roller 93 comes into contact with the block 57 of the middle section 52. Then, the roller 93 is guided by the slope 57a and smoothly pressed down. Consequently, when the distal end of the lower section 53 bends downwardly, the coupler 95 is held in a horizontal state. Thus, the mover 91 rotates in the θY direction around the central axis AX4 of the shaft 92 and the sensor fixture 91b rotates in the θY direction as well, whereby correction is performed such that the laser light L1 emitted from the swing detection sensor 47 is emitted toward a certain position (the reflecting plate 49 illustrated in FIG. 1 or other drawings).

That is, the emission direction of the laser light L1 emitted from the swing detection sensor 47 is corrected in conjunction with the projecting movement of the lower section 53. This configuration enables correction of the emission direction of the laser light L1 by using a simple structure in conjunction with the projecting operation of the lateral extender 45 instead of using an actuator or other mechanisms. An orientation of the coupler 95 (the emission direction of the laser light L1 after correction) when the lower section 53 projects is settable by the thickness (a dimension in the Z direction) of the blocks 57 and 58.

FIG. 11(C) illustrates an example in which the lower section 53 projects toward the −X side. However, the configuration is not limited to this example. The same movement applies to a case in which the middle section 52 and the lower section 53 project toward the +X side. In this case, the block 58 on the +X side of the middle section 52 presses the roller 94 down on the −X side and moves the coupler 95 to be in a horizontal state. With this movement, the mover 91 rotates in the θY direction so that the emission direction of the laser light L1 emitted from the swing detection sensor 47 is corrected.

Figure 12:
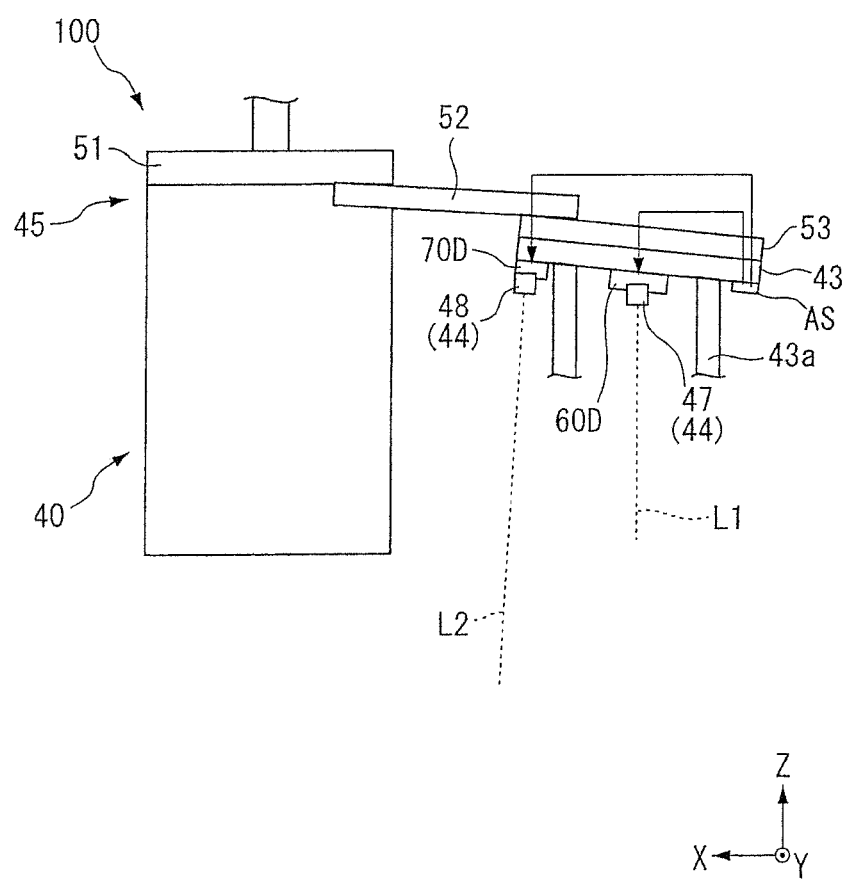
FIG. 12 is a diagram illustrating another example of the corrector.

FIG. 12 is a diagram illustrating another example of the corrector. As illustrated in FIG. 12, the lift driver 43 is provided with a tilt sensor AS for detecting a tilt of the lift driver 43. On the basis of a result of detection by the tilt sensor AS, a controller, which is not illustrated, transmits a control signal to each of a first corrector 60D and a second corrector 70D.

The first corrector 60D includes an actuator such as an electric motor. The actuator is capable of adjusting the tilt of the swing detection sensor 47 such that the laser light L1 emitted from the swing detection sensor 47 is directed toward the reflecting plate 49 on the basis of the result of the detection by the tilt sensor AS. The second corrector 70D includes an actuator such as an electric motor. The actuator is capable of adjusting the tilt of the lookdown sensor 48 such that the laser light L2 emitted from the lookdown sensor 46C is directed toward the vicinity of a lowering destination of the lift platform 42 on the basis of the result of the detection by the tilt sensor AS.

In this manner, a tilt of the lift driver 43 is detected by the tilt sensor AS and the orientation of the swing detection sensor 47 and a tilt of the lookdown sensor 48 are adjusted on the basis of the tilt of the lift driver 43 and, thus, a shift in the emission directions of the laser light L1 and L2 emitted from the swing detection sensor 47 and the lookdown sensor 48, respectively, are easily correctable.

The examples have been described above. However, this disclosure is not limited thereto. The examples can be modified in various forms without departing from the gist of my vehicles and methods. For example, the corrector described above is merely an example, and a corrector having another configuration may be employed. The sensors 44 are not limited to the swing detection sensor 47 and the lookdown sensor 48, and may be any sensor that emits a detection wave having directivity. In addition, the contents of Japanese Patent Application No. 2016-101338 and all publications cited herein are incorporated herein by reference.

The invention claimed is:

1. A transport vehicle comprising:
   a body;
   a lift platform that includes a holder to hold an article, the lift platform being ascendable and descendable with respect to the body;
   a lift driver that raises or lowers the lift platform by feeding out or taking up a flexible suspension support;
   a sensor provided in the lift driver and emits a detection wave having directivity toward a certain lower position;
   a lateral extender that causes the lift driver to project laterally from the body while providing cantilever support for the lift driver; and
   a corrector that corrects a shift in an emission direction of the detection wave that arises from bending of the lateral extender in a state in which the lift driver is caused to project laterally from the body by the lateral extender.

2. The transport vehicle according to claim 1, wherein the corrector changes an angle of the sensor with respect to the lift driver.

3. The transport vehicle according to claim 2, wherein the corrector includes an actuator that changes the angle of the sensor.

4. The transport vehicle according to claim 3, wherein the sensor is at least one of:
   a swing detection sensor that detects whether the detection wave is emitted to a certain range of the lift platform when the lift platform is raised or lowered; and
   a lookdown sensor that emits the detection wave to a vicinity of a lowering destination of the lift platform to detect whether a foreign matter is present.

5. The transport vehicle according to claim 2, wherein the corrector changes the angle of the sensor by gravity.

6. The transport vehicle according to claim 5, wherein the sensor is at least one of:
   a swing detection sensor that detects whether the detection wave is emitted to a certain range of the lift platform when the lift platform is raised or lowered; and
   a lookdown sensor that emits the detection wave to a vicinity of a lowering destination of the lift platform to detect whether a foreign matter is present.

7. The transport vehicle according to claim 2, wherein the corrector changes the angle of the sensor in conjunction with projecting movement of the lift driver by the lateral extender.

8. The transport vehicle according to claim 7, wherein the sensor is at least one of:
- a swing detection sensor that detects whether the detection wave is emitted to a certain range of the lift platform when the lift platform is raised or lowered; and
- a lookdown sensor that emits the detection wave to a vicinity of a lowering destination of the lift platform to detect whether a foreign matter is present.

9. The transport vehicle according to claim 2, wherein the sensor is at least one of:
- a swing detection sensor that detects whether the detection wave is emitted to a certain range of the lift platform when the lift platform is raised or lowered; and
- a lookdown sensor that emits the detection wave to a vicinity of a lowering destination of the lift platform to detect whether a foreign matter is present.

10. The transport vehicle according to claim 1, wherein the sensor is at least one of:
- a swing detection sensor that detects whether the detection wave is emitted to a certain range of the lift platform when the lift platform is raised or lowered; and
- a lookdown sensor that emits the detection wave to a vicinity of a lowering destination of the lift platform to detect whether a foreign matter is present.

11. A transport method that transports an article by a transport vehicle, the transport vehicle including:
- a body;
- a lift platform that includes a holder to hold the article, the lift platform being ascendable and descendable with respect to the body;
- a lift driver that raises or lowers the lift platform by feeding out or taking up a flexible suspension support;
- a sensor provided in the lift driver and emits a detection wave having directivity toward a certain lower position; and
- a lateral extender that causes the lift driver to project laterally from the body while providing cantilever support for the lift driver, the transport method comprising:
when the lateral extender causes the lift driver to project laterally from the body, correcting a shift in an emission direction of the detection wave that arises from bending of the lateral extender.

* * * * *